(12) United States Patent
Guarnera et al.

(10) Patent No.: US 8,455,318 B2
(45) Date of Patent: Jun. 4, 2013

(54) PROCESS FOR MANUFACTURING A POWER SEMICONDUCTOR DEVICE HAVING CHARGE-BALANCE COLUMNAR STRUCTURES ON A NON-PLANAR SURFACE, AND CORRESPONDING POWER SEMICONDUCTOR DEVICE

(75) Inventors: Alfio Guarnera, Trecastagni (IT); Mario Giuseppe Saggio, Acicastello (IT); Ferruccio Frisina, Sant'Agata Li Battiati (IT)

(73) Assignee: STMicroelectronics S.r.l., Agrate Brianza (MI) (IT)

( * ) Notice: Subject to any disclaimer, the term of this patent is extended or adjusted under 35 U.S.C. 154(b) by 283 days.

(21) Appl. No.: 12/298,025

(22) PCT Filed: Apr. 21, 2006

(86) PCT No.: PCT/IT2006/000273
§ 371 (c)(1),
(2), (4) Date: Oct. 21, 2008

(87) PCT Pub. No.: WO2007/122646
PCT Pub. Date: Nov. 1, 2007

(65) Prior Publication Data
US 2009/0179263 A1    Jul. 16, 2009

(51) Int. Cl.
*H01L 21/336* (2006.01)
*H01L 29/66* (2006.01)

(52) U.S. Cl.
USPC .......... 438/270; 438/268; 257/341; 257/342; 257/401; 257/E21.418; 257/E29.257; 257/E29.262; 257/E29.26; 257/E29.256; 257/329

(58) Field of Classification Search
USPC .......... 257/341, 342, 401, E21.418, E29.257, 257/328–330
See application file for complete search history.

(56) References Cited

U.S. PATENT DOCUMENTS 6,228,719 B1    5/2001    Frisina et al.
6,300,171 B1    10/2001    Frisina
(Continued)

FOREIGN PATENT DOCUMENTS

WO        0145155        6/2001
WO    2007116420        10/2007

OTHER PUBLICATIONS

International Search Report for International Patent Application Serial No. PCT/IT2006/000244; European Patent Office, Feb. 2, 2007.

(Continued)

*Primary Examiner* — Steven Loke
*Assistant Examiner* — Aaron Dehne
(74) *Attorney, Agent, or Firm* — Wolf, Greenfield & Sacks, P.C.

(57) ABSTRACT

An embodiment of a process for manufacturing a power semiconductor device envisages the steps of: providing a body of semiconductor material having a top surface and having a first conductivity; forming columnar regions having a second type of conductivity within the body of semiconductor material, and surface extensions of the columnar regions above the top surface; and forming doped regions having the second type of conductivity, in the proximity of the top surface and in contact with the columnar regions. The doped regions are formed at least partially within the surface extensions of the columnar regions; the surface extensions and the doped regions have a non-planar surface pattern, in particular with a substantially V-shaped groove.

35 Claims, 6 Drawing Sheets

U.S. PATENT DOCUMENTS

| | | |
|---|---|---|
| 6,404,010 B2 | 6/2002 | Saggio et al. |
| 6,495,294 B1 * | 12/2002 | Yamauchi et al. ............ 438/597 |
| 6,586,798 B1 | 7/2003 | Frisina |
| 6,888,195 B2 * | 5/2005 | Saito et al. ................... 257/328 |
| 2002/0185705 A1 * | 12/2002 | Saitoh et al. .................. 257/492 |
| 2003/0025124 A1 | 2/2003 | Deboy |
| 2003/0119283 A1 * | 6/2003 | Ishibashi et al. ............. 438/478 |
| 2003/0219933 A1 | 11/2003 | Yamauchi et al. |
| 2003/0224588 A1 * | 12/2003 | Yamauchi et al. ........... 438/524 |
| 2004/0016959 A1 | 1/2004 | Yamaguchi et al. |
| 2004/0185665 A1 | 9/2004 | Kishimoto et al. |
| 2005/0006717 A1 | 1/2005 | Yamaguchi et al. |
| 2005/0221547 A1 | 10/2005 | Yamauchi et al. |
| 2006/0157813 A1 * | 7/2006 | Saito et al. .................... 257/498 |

OTHER PUBLICATIONS

International Search Report for International Patent Application Serial No. PCT/IT2006/000273; European Patent Office Feb. 1, 2007.

* cited by examiner

PROCESS FOR MANUFACTURING A POWER SEMICONDUCTOR DEVICE HAVING CHARGE-BALANCE COLUMNAR STRUCTURES ON A NON-PLANAR SURFACE, AND CORRESPONDING POWER SEMICONDUCTOR DEVICE

PRIORITY

The present application claims benefit pursuant to 35 USC §371 of United States Patent Application Serial No. PCT/IT2006/000273, published in English, filed Apr. 21, 2006, which is incorporated herein by reference in its entirety.

CROSS REFERENCE TO RELATED APPLICATIONS

This application is related to U.S. patent application Ser. No. 12/296,921, filed Oct. 10, 2008, entitled PROCESS FOR MANUFACTURING A SEMICONDUCTOR POWER DEVICE COMPRISING CHARGE-BALANCE COLUMN STRUCTURES AND RESPECTIVE DEVICE, which is incorporated herein by reference in its entirety.

TECHNICAL FIELD

An embodiment of the present disclosure relates to a process for manufacturing a power semiconductor device having charge-balance columnar structures on a non-planar surface, and to a corresponding power semiconductor device. In particular, the ensuing treatment will make explicit reference, without this implying any loss of generality, to the manufacturing of a power MOS device.

BACKGROUND

In the last few years a wide range of solutions have been developed in order to increase the efficiency of power semiconductor devices, in particular in terms of increase in the breakdown voltage and decrease in the output resistance.

For example, U.S. Pat. Nos. 6,586,798, 6,228,719, 6,300,171 and 6,404,010, all commonly owned and incorporated by reference, describe vertical-conduction power semiconductor devices, wherein, within an epitaxial layer forming part of a drain region having a given conductivity type, columnar structures of opposite conductivity are formed. These columnar structures have a dopant concentration equal and opposite to the dopant concentration of the epitaxial layer, so as to enable a substantial charge balance (the so-called multi-drain or MD technology). The charge balance enables high breakdown voltages to be obtained, and, in addition, the high dopant concentration of the epitaxial layer enables a low output resistance (and hence low losses in conduction) to be obtained. The use of MD technology has enabled the so-called "ideal limit of silicon" to be overcome.

In summary, the formation of the aforesaid columnar structures envisages a sequence of steps of growth of N-type epitaxial layers, each step being followed by a step of implantation of a P-type dopant. The implanted regions are stacked so as to form the columnar structures. Next, body regions of the power device are formed in contact with the columnar structures, so that the columnar structures constitute an extension of the body regions within the drain region.

The evolution of said technology has witnessed a progressive increase in the density of the elementary strips forming the devices in order to further increase the concentration of charge of the epitaxial layer and to obtain devices which, given the same breakdown voltage (which is substantially related to the height of the columnar structures), have a lower output resistance. On the other hand, however, the increase in the density of the elementary strips entails a corresponding increase in the number of the steps of epitaxial growth and a reduction in the thermal budget of the devices, and consequently an increase in the manufacturing costs and times, and in the defectiveness intrinsically linked to the steps of epitaxial growth.

Alternative technologies have consequently been developed to obtain the charge-balance columnar structures, said technologies envisaging, for example, formation of trenches within the epitaxial layer and subsequent filling of said trenches with semiconductor material appropriately doped to obtain the charge balance.

For example, solutions are known according to which the trenches are filled via steps of epitaxial growth of semiconductor material (see for example U.S. Pat. No. 6,495,294, US 2003224588 and US 2003219933 which are incorporated by reference), possibly alternated by steps of etching of surface-growth portions. In particular, a non-selective epitaxial growth also involves a top surface of the layer in which the trenches are provided, and at the end of the epitaxial process a wrinkled surface layer of semiconductor material is consequently formed, characterized by the presence of a plurality of grooves in areas corresponding to the columnar structures. The known techniques envisage removal of the wrinkled surface layer via the CMP (Chemical-Mechanical Polishing) technique in order to planarize the top surface prior to formation of body, gate and source structures of the power devices.

As a whole, the solutions described for obtaining power devices with charge-balance structures may not be satisfactory, either as regards the complexity and costs of their manufacturing and as regards attainment of a real charge balance (for example, due to a poor uniformity of the spatial charge distribution or due to the presence of residual defects).

SUMMARY

An embodiment of the present disclosure is a process for manufacturing a charge-balance power device that enables the aforesaid problems and disadvantages to be overcome, and that is simple and inexpensive to carry out.

BRIEF DESCRIPTION OF THE DRAWINGS

For a better understanding of the concepts described herein, embodiments are now described, purely by way of non-limiting example and with reference to the attached drawings, wherein.

DETAILED DESCRIPTION

Figure 1:
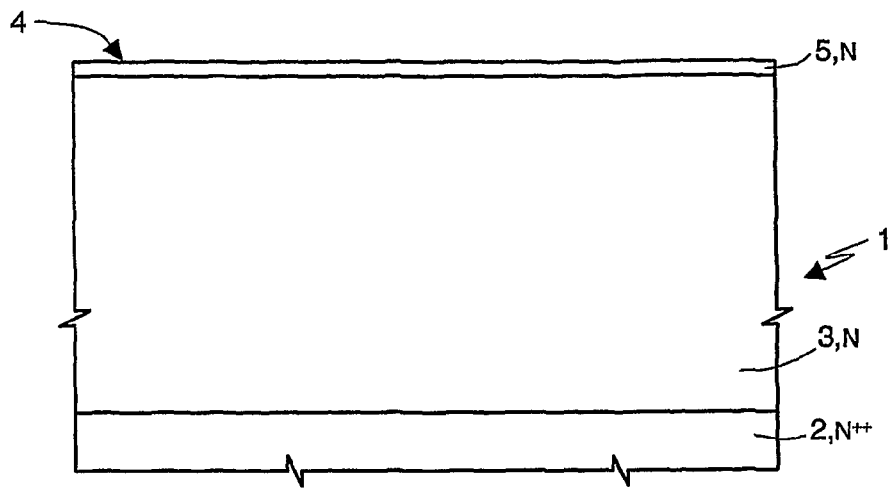
FIGS. 1 to 8 show cross sections through a wafer of semiconductor material regarding successive steps of a manufacturing process according to a first embodiment of the present disclosure.

FIG. 1 shows a wafer/of semiconductor material, typically silicon, comprising a substrate 2 having a first type of conductivity, for example, an N++ type with resistivity of less than approximately 10 Ω·cm, and an epitaxial layer 3, which also has the first type of conductivity, for example, an N type with a resistivity of approximately between 0.1 Ω·cm and 2 Ω·cm.

The wafer/has, for example, a surface orientation <100>, and the epitaxial layer 3 has a top surface 4. Over the entire wafer an implantation of an N type with low energy (approximately 50-100 keV) and dosage of approximately between $10^{11}$ and $10^{13}$ at/cm² is carried out, without masking, in order to form a surface-implant layer 5 in the proximity of the top surface 4 of the epitaxial layer 3.

Figure 2:
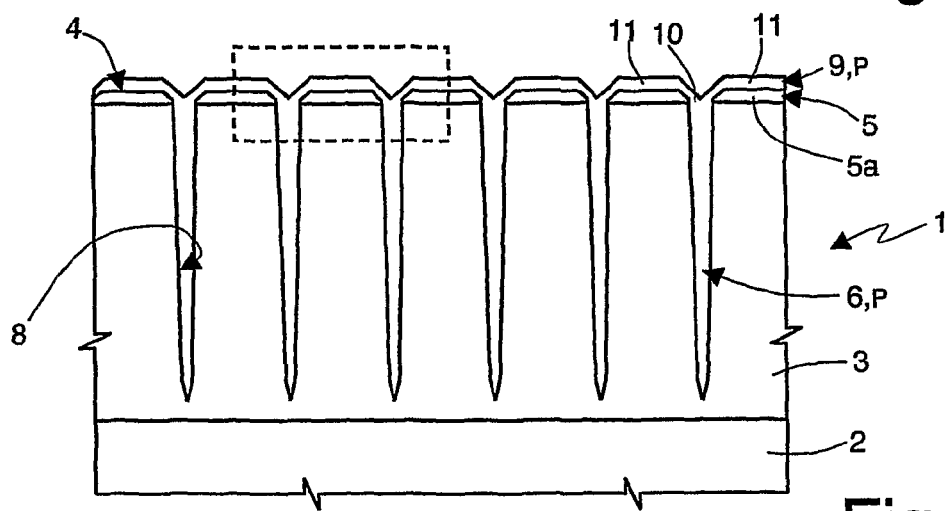

Next (FIG. 2), within the epitaxial layer 3 a plurality of columnar structures 6 for charge balance is formed. As has been described in detail in the copending patent application PCT/IT2006/000244 filed on Apr. 11, 2006, the process for forming the columnar structures 6 envisages in the first place formation, by means of anisotropic dry etching through a purposely provided masking, of deep trenches 8 within the epitaxial layer 3 (and hence through the surface-implant layer 5), having for example a width, at the level of the top surface 4, of approximately between 0.8 and 2 µm and a smaller width on the bottom of approximately between 0.2 and 1.4 µm. In addition, the height of the deep trenches 8 ranges, for example, from approximately 5 to 50 µm and determines, together with the thickness of the epitaxial layer 3, the voltage class of the final device (for example, a voltage class of 100 V corresponds to a height of 5 µm, whereas a voltage class of 600 V corresponds to a height of 30 µm). The cut-off voltage of the resulting device can range approximately between 100 and 1500 V, according to the thickness of the epitaxial layer 3. Then, the wafer/is subjected to an annealing treatment in a hydrogen environment at a temperature of approximately 1000-1150° C. for a treatment time of approximately 1 to 15 min. Said treatment, in addition to removing the damage due to the previous dry etch, leads to exposure, on the bottom of the deep trenches 8, of the crystallographic planes <100> and <130> and, along the side walls, of the plane <010> (the deep trenches 8 consequently assume the shape visible in FIG. 2). Next, the deep trenches 8 are filled via epitaxial growth with silicon doped with a second conductivity type, in the example, the P type (for instance, doped with boron ions). In particular, the epitaxial growth occurs by supplying flows of a gas containing silicon (for example, dichlorosilane) and of a gas containing boron (for example, diborane), and control of doping is ensured maintaining an approximately constant gradient of growth in the flow of diborane (for example, setting a linear ramp increasing from an initial flow value to a final flow value twice the initial one), and maintaining the flow of dichlorosilane approximately constant. Given that the growth is not selective with respect to the deep trenches 8, the epitaxial growth occurs both within the trenches starting from the side walls, at a higher rate in the proximity of the surface, and on the outside of the trenches, in particular on the top surface 4 of the epitaxial layer 3. In order to prevent premature closing of the deep trenches 8 due to the encounter of the fronts of growth from the walls, successive steps of epitaxial growth are consequently alternated with etching steps, for example with HCl, of the surface-growth portions (the so-called multi-step process). At the end of said process sequence, the structure shown in FIG. 2 is obtained, with formation of the columnar structures 6, filling the deep trenches 8 substantially completely and having a substantially uniform spatial distribution of dopant and reduced presence of defects (for example voids). The process of non-selective epitaxial growth involves also the top surface 4 of the epitaxial layer 3, over which a wrinkled surface layer 9 of a P type is formed, with grooves in areas corresponding to the columnar structures 6. In particular, each columnar structure 6 has thus a surface extension 10, at and over the top surface 4, having a non-planar surface pattern and a characteristic grooved, in particular V-shaped, cross section. Connection portions 11 of the wrinkled surface layer 9, having a planar surface pattern, connect the surface extensions 10 of adjacent columnar structures 6. In addition, said adjacent columnar structures 6 are separated, at the top surface 4, by respective implant portions 5a of the implant layer 5.

The subsequent figures show for greater clarity an enlargement of a surface portion of the wafer 1, shown by a dashed rectangle in FIG. 2, which encloses a pair of adjacent columnar structures 6 (in practice, two strips of the device). It is clear, however, that the process steps described hereinafter regard also the remaining part of the device.

As will be clarified hereinafter, an embodiment of the present disclosure envisages providing a power device on a non-planar surface partially within the wrinkled surface layer 9, exploiting portions of said layer, in particular the surface extensions 10 of the columnar structures 6, as active areas of the device. In other words, the process according to an embodiment of the disclosure does not envisage a preventive step of planarization of the wafer surface (for example via CMP), with advantages in terms of costs and simplicity of manufacturing.

Figure 3:
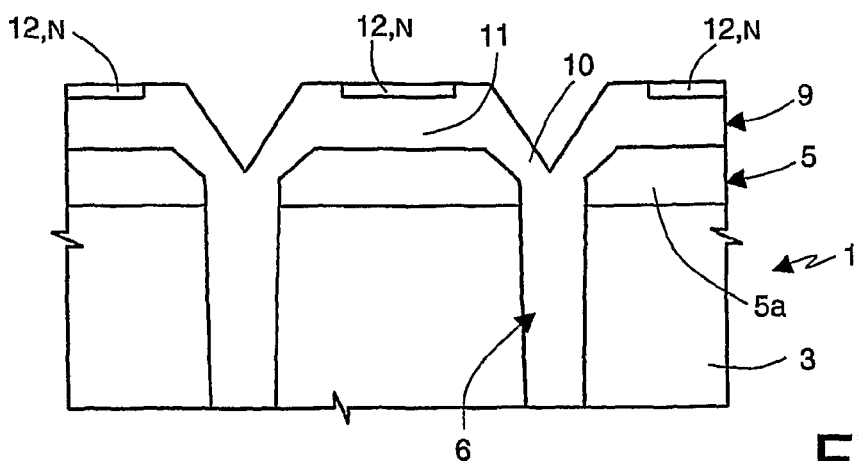

In detail (FIG. 3), in a surface region of the connection portions 11, implants of an N type are performed, through a purposely provided mask, for example, with medium energy (approximately 80-160 keV) and a dosage of approximately between $5 \cdot 10^{11}$ and $10^{13}$ at/cm², in order to form surface contact regions 12.

Figure 4:
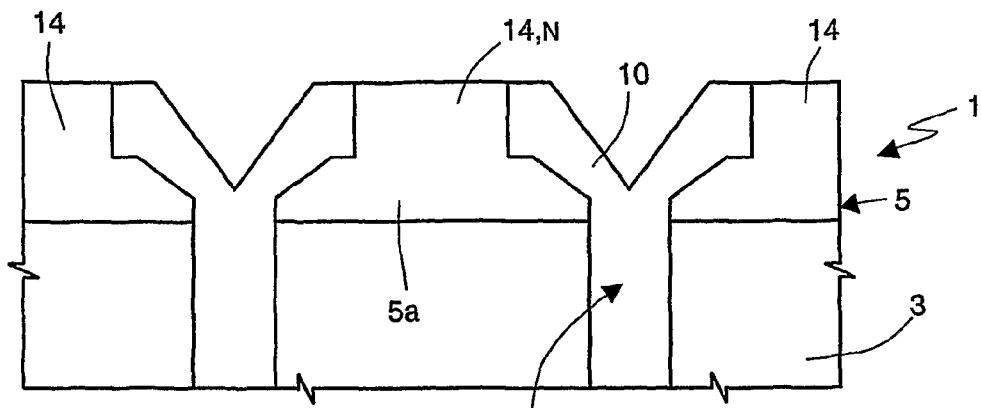

Then (FIG. 4), a process of thermal diffusion is performed to provide sinkers 14 of an N type, which reverse the conductivity of the respective connection portions 11 and reach the underlying implant portions 5a, which are also of an N type. The diffusion process can possibly be omitted when the conditions of the prior implant (in terms of dosage and energy) and the thickness of the wrinkled surface layer 9 enable formation of the sinkers 14 even in the absence of said process. It should be noted in any case that the sinkers 14 separate adjacent surface extensions 10, enabling, as will be described in detail hereinafter, formation of devices having a cell structure.

Figure 5:
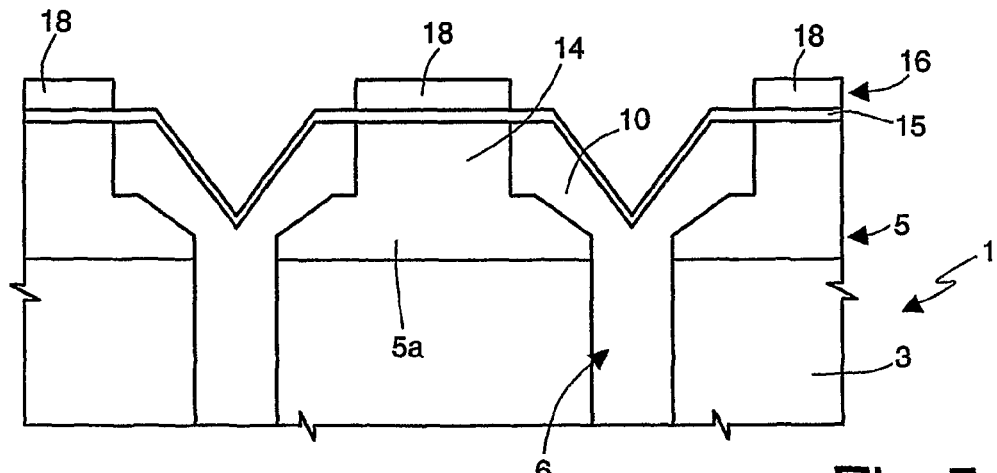

Next, a gate oxide layer 15 (made of thermal oxide), of a thickness of approximately between 20 nm and 150 nm, is grown over the wafer 1 in the active area, and a polysilicon layer 16, having a thickness of approximately between 200 nm and 700 nm, is then formed over the gate oxide layer 15. The polysilicon layer 16 is etched via selective dry etching through a purposely provided mask so as to obtain gate regions 18 above the sinkers 14 (FIG. 5).

Figure 6:
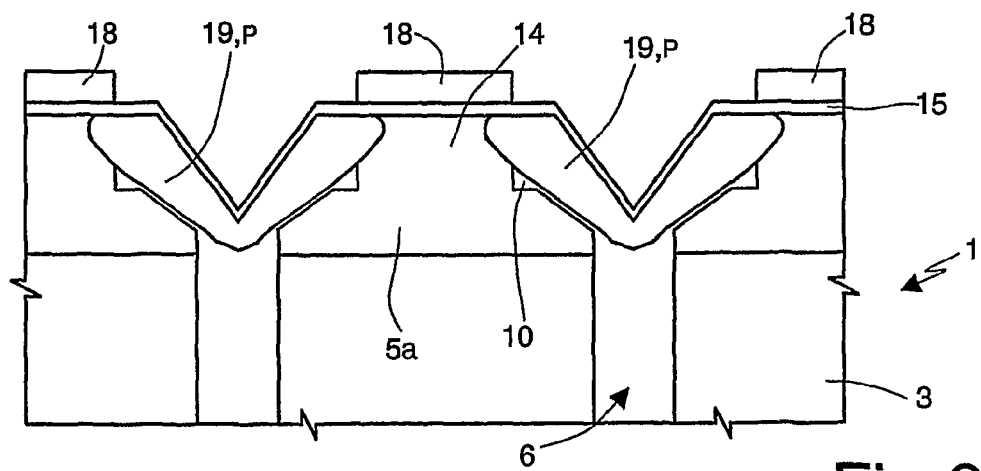

Next (FIG. 6), through the gate oxide layer 15 and exploiting the gate regions 18 as hard masks, a body implant is carried out, for example, with boron atoms and an implant dosage of approximately between $10^{13}$ and $10^{14}$ at/cm² and an energy of approximately between 80 and 200 keV (chosen as a function of the thickness of the gate regions 18), followed by a thermal process of diffusion to form body regions 19. In particular, the body regions 19 are formed within the surface extensions 10 of the columnar structures 6, consequently reproducing the non-planar pattern with grooved cross section, and partially within the sinkers 14 underneath the gate regions 18 (where they form channel regions of the power device).

Figure 7:
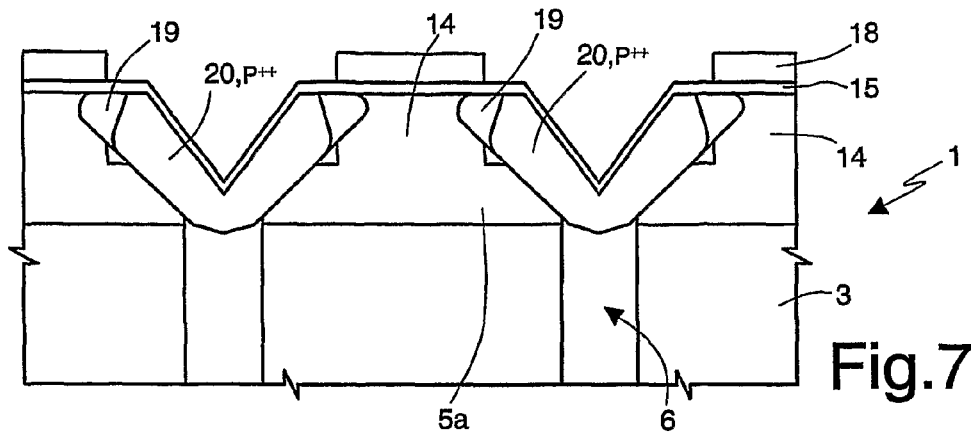

Next, through a purposely provided masking (not illustrated) aligned with the mask that has defined the gate regions 18, a deep-body implantation of a P++ type is carried out using boron ions with an implantation dosage of approximately between $5 \cdot 10^{14}$ and $5 \cdot 10^{15}$ at/cm$^2$ and an energy of approximately between 80 and 300 keV. There follows a thermal process of diffusion to form deep-body regions 20 in a central area of the surface extensions 10 (FIG. 7).

Next (FIG. 8), through a purposely provided masking, a source implantation of an N$^+$ type is carried out, for example with atoms of phosphorus P or arsenic As with an implantation dosage of approximately between $5 \cdot 10^{14}$ and $5 \cdot 10^{15}$ at/cm$^2$ and an energy of approximately between 60 and 200 keV, to form first and second source regions 22a, 22b within the body regions 19 and deep-body regions 20. In particular, the first source regions 22a occupy surface portions of body regions of first columnar structures 6a entirely, whilst the second source regions 22b are arranged in outer surface portions of body regions of second columnar structures 6b, which alternate with the first columnar structures 6a within the epitaxial layer 3 (so as to obtain subsequently, for known reasons, a short circuit between the source and body regions of the power device).

Next, a process of deposition of an intermediate dielectric layer 23 with a thickness of approximately between 500 nm and 1 μm is carried out, as well as a thermal activation process. Then contacts are opened, by means of masking and subsequent etching of the intermediate dielectric layer 23 and gate oxide layer 15; said etching being entirely dry, or wet for a first part and dry for a second part. Next, for example by means of a sputtering process, metallization of the front of the wafer/is performed, with formation of a metal layer 24, the thickness of which depends upon the capacity to sustain current to be guaranteed for the device.

The process ends with final steps of a known type, including etching of the metal layer 24, deposition of a passivation layer and a subsequent step of masking and etching of the passivation layer, and a process of finishing of the back.

At the end of the manufacturing process, a power MOS device 25 is obtained on a non-planar surface, with the oxide and the gate region in the planar area, and the body region in the non-planar area (in particular within the surface extension of a charge-balance columnar structure).

Figure 8:
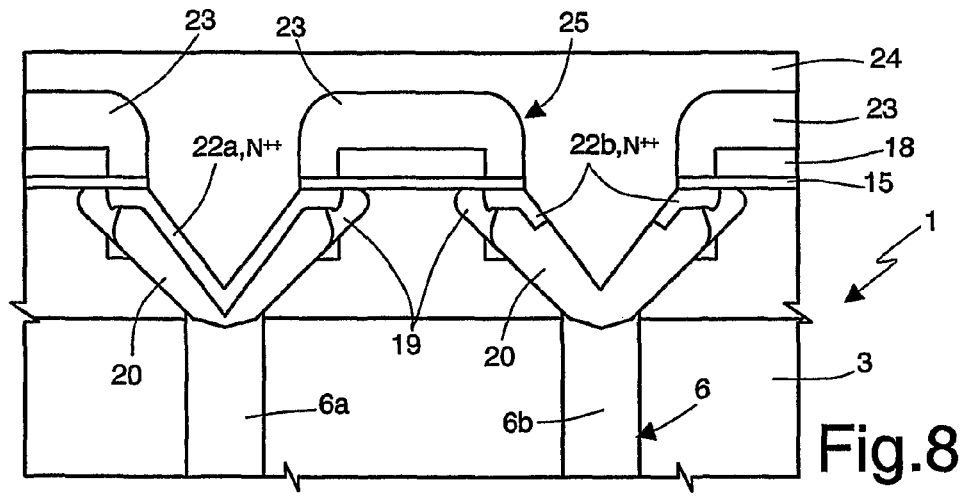
Figure 9:
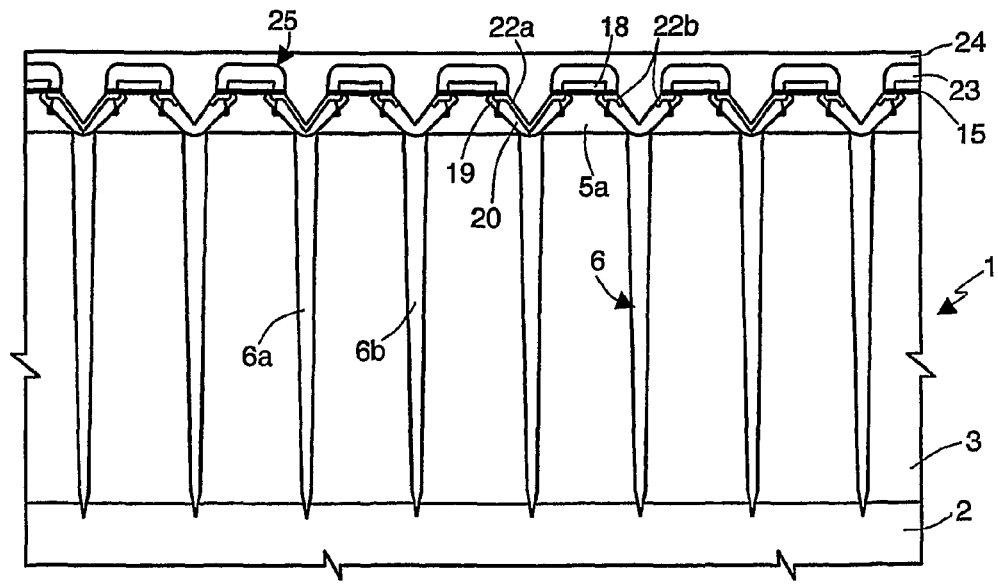
FIGS. 9 and 10 show possible variants of the first embodiment of the present disclosure.

FIG. 9 shows a variant of the structure of FIG. 8, in which the columnar structures 6 extend throughout the thickness of the epitaxial layer 3 and terminate at the bottom within the substrate 2.

Figure 10:
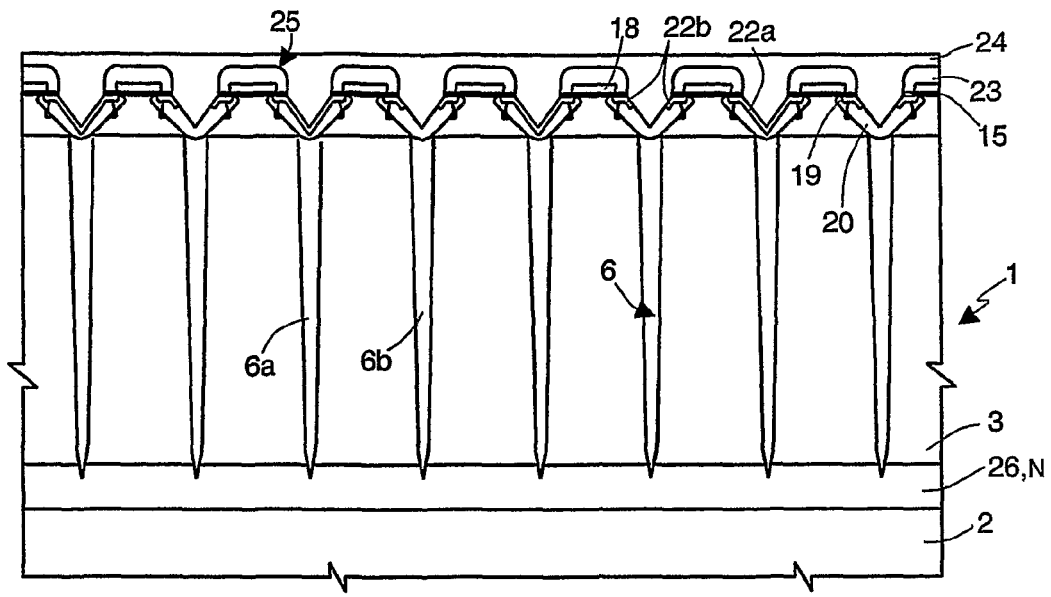

FIG. 10 shows a further variant of the structure of FIG. 8, in which a buffer layer 26, of an N type, extends between the substrate 2 and the epitaxial layer 3. In this case, the columnar structures 6 terminate inside the buffer layer 26. In particular, the presence of the buffer layer 26 enables a greater control over the dopant concentration in the proximity of the bottom of the columnar structures 6 to be achieved, and consequently also control of concentrations of electric field that could lead to phenomena of breakdown of the device.

A second embodiment of the present disclosure is now described, with reference to FIGS. 11-17, in which elements corresponding to the ones previously described are designated by the same reference numbers.

In detail, in an initial step of the manufacturing process, the charge-balance columnar structures 6 are formed in the epitaxial layer 3 overlying the substrate 2, in a way altogether similar to what has been described previously. At the end of said step, the wrinkled surface layer 9 is formed on the top surface 4 of the epitaxial layer 3, said wrinkled surface layer 9 comprising the surface extensions 10 of the columnar structures 6 and the connection portions 11 having a substantially planar pattern (FIG. 11).

Figure 11:
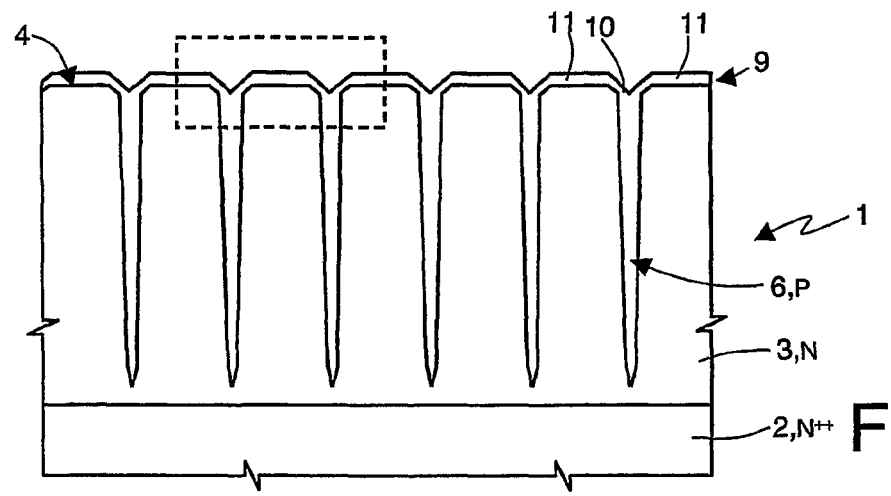
FIGS. 11 to 17 show cross sections through a wafer of semiconductor material regarding successive steps of a manufacturing process according to a second embodiment of the present disclosure.

Once again, the subsequent figures show, for reasons of greater clarity, an enlargement of a surface portion of the wafer 1, shown by a dashed rectangle in FIG. 11, which encloses a pair of adjacent columnar structures 6.

Figure 12:
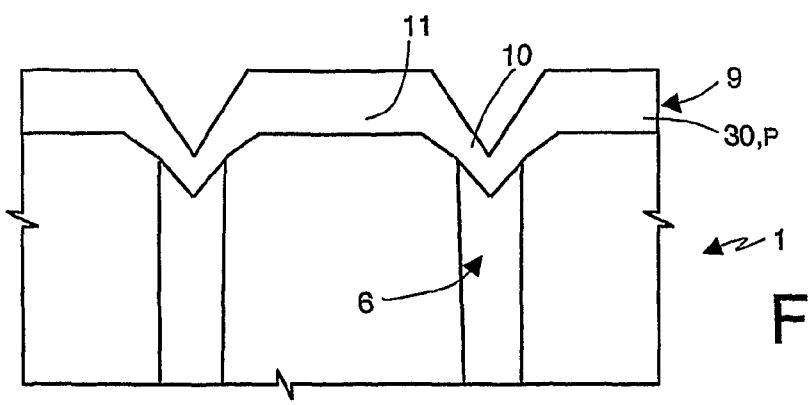
Figure 13:
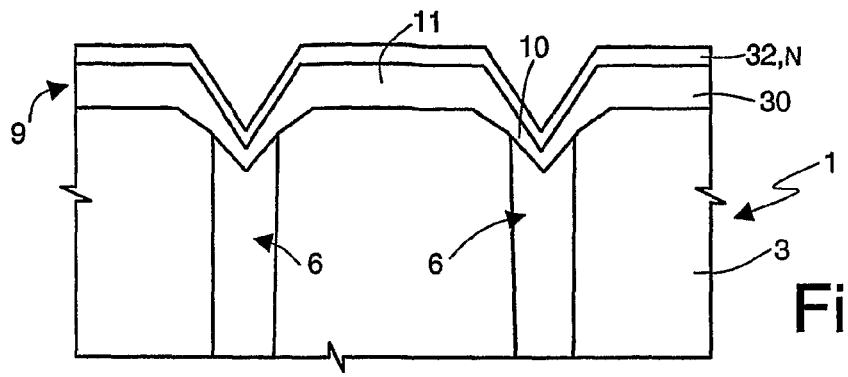
Figure 14:
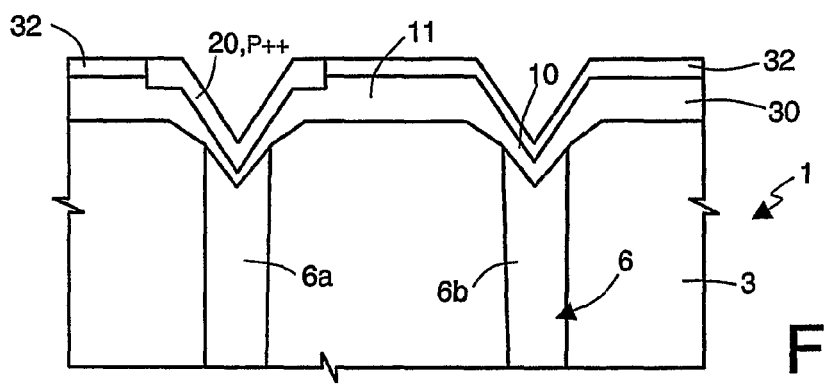
Figure 15:
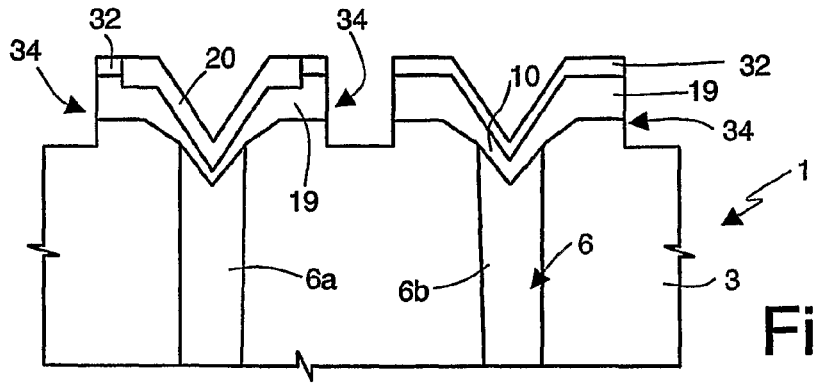

Then, over the surface of the wafer 1 an implantation of a P type is carried out, without masking, for example using boron with an implantation dosage of approximately between $10^{13}$ and $10^{14}$ at/cm$^2$ and an energy of approximately between 80 and 200 keV, to form a body layer 30 (FIG. 12).

Possibly, the implantation can be carried out through a sacrificial oxide of appropriate thickness (ion pre-implantation oxide) and be followed by a purposely provided process of diffusion. The body layer 30 extends within the wrinkled surface layer 9, and in particular at the surface extensions 10 of the columnar structures 6.

Next (FIG. 13), over the surface of the wafer 1, once again without masking, a blanket implantation of an N type is carried out, for example using phosphorus or arsenic with an implantation dosage of between $5 \cdot 10^{14}$ and $5 \cdot 10^{15}$ at/cm$^2$ and an energy of between 60 and 200 keV, to form a source layer 32 in a surface portion of the wafer 1.

Through a purposely provided mask, two successive implantations of a P type are then carried out (FIG. 14): a first surface implantation for enriching contact with the region of a P type, with a dosage of approximately between $10^{14}$ and $10^{15}$ at/cm$^2$ and an energy of approximately between 30 and 100 key; and a second deep implantation to obtain deep-body regions, designated once again by 20, with a dosage of approximately between $5 \cdot 10^{14}$ and $5 \cdot 10^{15}$ at/cm$^2$ and an energy of approximately between 80 and 300 keV. In particular, the deep-body regions 20 are formed in positions corresponding to the surface extensions of first columnar structures 6a, and not in second columnar structures 6b that alternate with the first columnar structures 6a within the epitaxial layer 3.

Next (FIG. 15), at the connection portions 11 of the wrinkled surface layer 9, surface trenches 34 are opened, which traverse said connection portions 11 and reach the underlying epitaxial layer 3. The surface trenches 34 also define body regions 19 of the power device. It should be noted that the surface trenches 34 separate adjacent surface extensions 10.

In the active area a gate oxide layer 15 (thermal oxide) of a thickness of between 20 nm and 150 nm is then deposited over the wafer 1, and on top of it a polysilicon layer 16, of a conformable type, is deposited. In particular, the polysilicon layer 16 fills the surface trenches 34 previously formed (FIG. 16).

Figure 17:
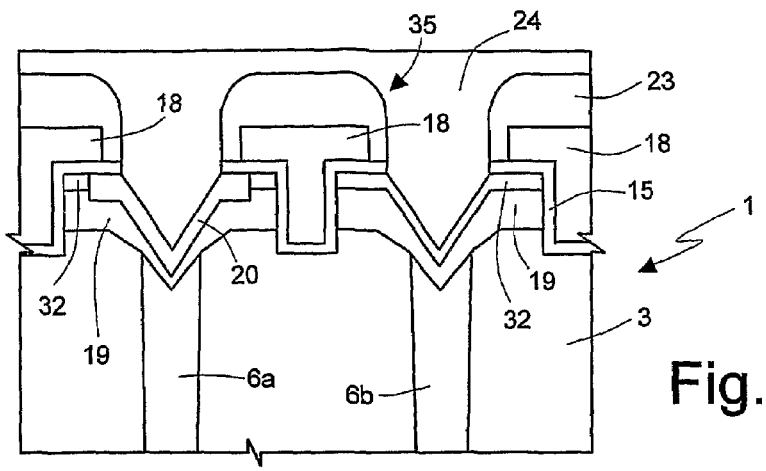

The polysilicon layer 16 is then etched by means of selective dry etching and a purposely provided masking so as to obtain gate regions 18 at the surface trenches 34 (FIG. 17). There follows the deposition of an intermediate dielectric layer 23 with a thickness of approximately between 500 nm and 1 μm. Then contacts are opened, by means of masking and subsequent etching of the intermediate dielectric layer 23 and of the gate oxide layer 15; said etching being entirely dry or wet in a first part and dry in a second part. A sputtering process leads to the metallization of the front of the wafer 1, with formation of a metal layer 24, the thickness of which depends upon the capacity to sustain current to be guaranteed for the device. The process terminates with final steps of a known type, in a way altogether similar to the one described previously.

At the end of the manufacturing process according to the second embodiment, a power MOS device 35 is consequently obtained on a non-planar surface, with the oxide and the channel region in an area defined by a trench-formation process. In particular, the channel region extends vertically within the body layer 30 between the source layer 32 and the epitaxial layer 3, at the sides of the trenches 34. Once again, the body region is in the non-planar area, within the surface extension of a charge-balance columnar structure.

Figure 16:
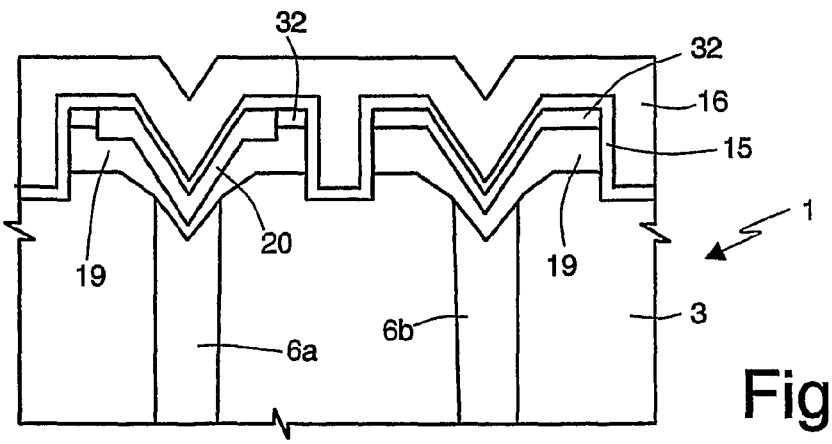
Figure 18:
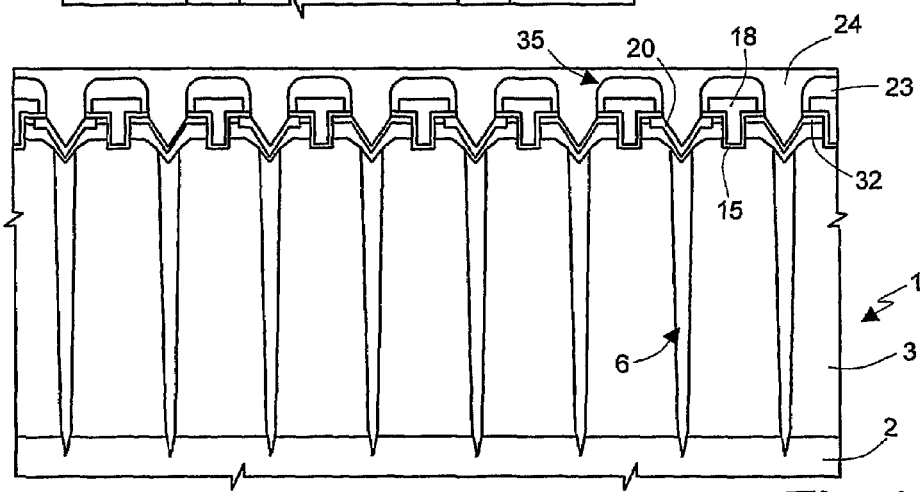
FIGS. 18 and 19 show possible variants of the second embodiment of the present disclosure.
Figure 19:
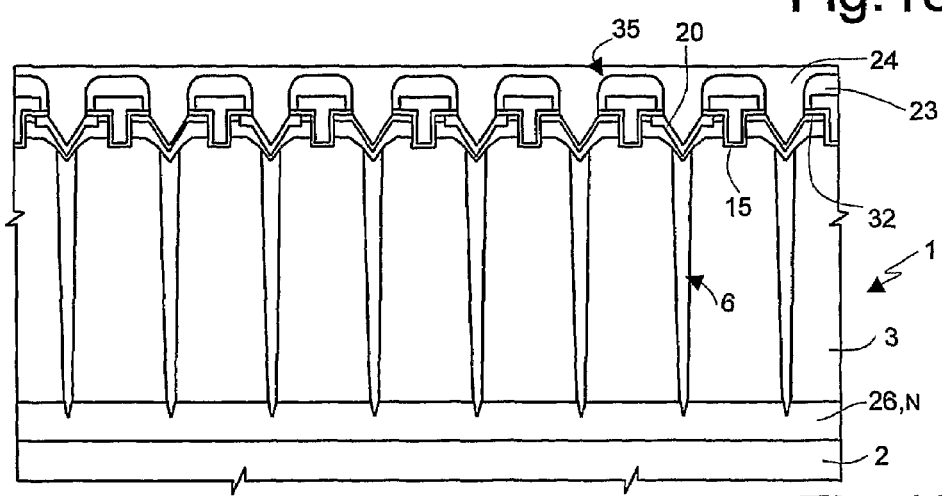

FIGS. 18 and 19 show variants of the structure of FIG. 16, in which the columnar structures 6 extend until the substrate 2 and a buffer layer 26, of an N type, arranged between the substrate 2 and the epitaxial layer 3 are, respectively, reached.

Advantages of the manufacturing process and of the corresponding power device are evident from the above description.

In any case, it is emphasized once again that the processes described enables charge-balance power devices to be obtained without resorting to a preventive step of planarization of the surface of the wafer of semiconductor material after the formation of the charge-balance columnar structures. The resulting power device has a cell structure with high-density strips, and is formed on a non-planar surface, with body regions within the surface extensions of the columnar structures that are formed in the process of non-selective epitaxial filling.

In particular, power MOS devices may be obtained with the channel and the gate structure formed in a planar area (first embodiment), or else in an area obtained by means of processes of trench formation (second embodiment).

Thanks to charge balance, it is possible to achieve values of resistivity of the epitaxial layer of less than approximately 2 Ω·cm, and values of cut-off voltage of approximately between 100 and 1500 V as a function of the thickness of the epitaxial region.

It is clear that modifications and variations can be made to what is described and illustrated herein, without thereby departing from the scope of the disclosure.

In particular, by applying the concepts described, it is possible to provide different power devices, for example an IGBT (Insulated-Gate Bipolar Transistor), a bipolar diode, or a Schottky diode.

Furthermore, the possibility of providing dual structures is evident, in which charge balance is obtained by formation of columnar structures with an N doping in an epitaxial layer having a P doping.

Moreover, a system such as an automobile may include first integrated circuit that includes a described power device, and included a second integrated circuit, such as a controller, coupled to the first integrated circuit.

The invention claimed is:

1. A process for manufacturing a power semiconductor device, comprising:
    providing a substrate of semiconductor material having a top surface and having a first type of conductivity;
    forming columnar regions having a second type of conductivity within said substrate, wherein the forming columnar regions includes forming surface extensions of said columnar regions at said top surface extending above and over regions of the substrate having the first type of conductivity;
    forming first doped regions having said second type of conductivity in the proximity of said top surface and in contact with said columnar regions, wherein the forming first doped regions comprises forming said first doped regions at least partially within said surface extensions; and
    forming second doped regions of the second type of conductivity at non-planar portions of the first doped regions, wherein the second doped regions form deep-body regions of the power semiconductor device.

2. The process according to claim 1, wherein said surface extensions and said first doped regions have a non-planar surface pattern.

3. The process according to claim 2, wherein said surface extensions and said first doped regions have a grooved or V-shaped surface pattern.

4. The process according to claim 1, wherein forming columnar regions comprises:
    forming deep trenches within said substrate; and
    filling said deep trenches with semiconductor material having the second type of conductivity via non-selective epitaxial growth so as to form said columnar regions within said deep trenches and said surface extensions above and over said top surface.

5. The process according to claim 4, wherein filling said deep trenches comprises supplying a gas containing said semiconductor material and a gas containing dopant ions; said supplying comprising varying a flow of said gas containing dopant ions.

6. The process according to claim 1, wherein said power semiconductor device is a MOS device and said first doped regions comprise body regions, further comprising:
    forming gate structures between adjacent columnar regions, at least in part above said top surface; and
    forming source regions having said first type of conductivity within said body regions.

7. The process according to claim 6, wherein forming columnar regions further comprises forming a wrinkled surface layer over said top surface, said wrinkled surface layer having said second type of conductivity and comprising said surface extensions and planar connection portions joining said surface extensions one to another; further comprising separating said surface extensions at the planar connection portions before forming said gate structures.

8. A process for manufacturing a power semiconductor device, comprising:
    providing a body of semiconductor material having a top surface and having a first type of conductivity;
    forming columnar regions having a second type of conductivity within said body of semiconductor material, forming columnar regions comprising forming surface extensions of said columnar regions extending above said top surface; and
    forming doped regions having said second type of conductivity in the proximity of said top surface and in contact with said columnar regions,
    wherein, forming doped regions comprises forming said doped regions at least partially within said surface extensions of said columnar regions;
    wherein said power semiconductor devices is a MOS device and said doped regions comprise body regions, further comprising:
        forming gate structures between adjacent columnar regions, at least in part above said top surface; and
        forming source regions having said first type of conductivity within said body regions;
    wherein forming columnar regions further comprises forming a wrinkled surface layer over said top surface, said wrinkled surface layer having said second type of conductivity and comprising said surface extensions and planar connection portions joining said surface extensions one to another; further comprising removing said planar connection portions in order to separate said surface extensions and interrupt said wrinkled surface layer, before forming said gate structures; and
    wherein providing a body of semiconductor material comprises forming a surface-implant layer having said first type of conductivity in the proximity of said top surface, and forming columnar regions comprises forming said columnar regions through said surface-implant layer; and wherein removing said planar connection portions comprises forming contact regions having said first type of conductivity through said planar connection portions as far as said surface-implant layer.

9. The process according to claim 8, wherein forming contact regions comprises: forming doped surface regions in surface portions of said planar connection portions, and diffusing said doped surface regions through said planar connection portions until said surface-implant layer is reached; and wherein forming said gate structures comprises forming an insulating region on said contact regions, and a conductive region on said insulating region; said insulating region and said conductive region having a substantially planar surface pattern.

10. A method for fabricating a power transistor, comprising:
forming a first trench in a first semiconductor layer of a first conductivity type;
growing a semiconductor material of a second conductivity type in the trench and over the semiconductor layer such that a depression forms in the semiconductor material over the trench;
causing a first region of the semiconductor material disposed over the semiconductor layer to have the second conductivity type;
causing a second region of the semiconductor material at non-planar portions of the first region to have the second conductivity type with a conductivity different from the first region, wherein the second region forms a deep-body region of the transistor; and
forming a source region of the first conductivity type over and in contact with a surface of the depression.

11. The method of claim 10 wherein forming the first trench comprises forming the first trench having at least one side that lies along a crystallographic plane of the semiconductor layer.

12. The method of claim 10 wherein forming first trench comprises forming the first trench in a second semiconductor layer over which the first semiconductor layer is disposed.

13. The method of claim 10, further comprising forming a gate region over the region of semiconductor material.

14. The process according to claim 1, wherein the second doped regions have a higher dopant concentration than the first doped regions.

15. The process according to claim 14, wherein the second doped regions are formed with an implantation dosage between approximately $5\times10^{14}$ at/cm$^2$ and approximately $5\times10^{15}$ at/cm$^2$.

16. The process according to claim 1, wherein the second doped regions separate regions of the first doped regions.

17. The process according to claim 1, wherein the top surface of the body of semiconductor material and columnar regions are not planarized after forming the columnar regions.

18. The process according to claim 1, wherein the doping level of the columnar regions is selected to substantially balance charge within a region of the substrate containing the columnar regions.

19. A process for manufacturing a power semiconductor device, comprising:
filling trenches in a semiconductor substrate of a first conductivity type with semiconductor material of a second conductivity type to form columnar structures and surface extensions, wherein the surface extensions extend over a top surface of the semiconductor substrate and form connection regions of the second conductivity type between the columnar structures;
converting portions of the connection regions to the first conductivity type to separate non-planar portions of the surface extensions; and
forming first doped regions of the second conductivity type at least partially within the non-planar portions of the surface extensions.

20. The process of claim 19, further comprising forming a gate structure for a transistor at the converted portions.

21. The process of claim 19, wherein the gate structure is a vertical gate structure.

22. The process of claim 19, wherein the converted portions are planar.

23. The process of claim 19, wherein said surface extensions have a grooved or V-shaped surface pattern.

24. The process of claim 19, wherein filling the trenches comprises non-selective epitaxial growth of the semiconductor material of the second conductivity type.

25. The process of claim 24, further comprising providing a gas containing dopant ions during the epitaxial growth.

26. The process of claim 19, further comprising forming second doped regions of the second type of conductivity at the non-planar portions of the first doped regions.

27. The process of claim 26, wherein the second doped regions have a higher dopant concentration than the first doped regions.

28. The process of claim 27, wherein the second doped regions are formed with an implantation dosage between approximately $5\times10^{14}$ at/cm$^2$ and approximately $5\times10^{15}$ at/cm$^2$.

29. The process of claim 27, further comprising forming source regions having the first conductivity type within at least a portion of the second doped regions.

30. The process of claim 29, wherein the source regions extend across the filled trenches for first alternating trenches and do not extend across the filled trenches for second alternating trenches.

31. The process of claim 29, wherein the first doped regions form body regions of the power semiconductor device and the second doped regions form deep-body regions of the power semiconductor device.

32. The process of claim 19, wherein the doping level of the columnar regions is selected to substantially balance charge within a region of the substrate containing the columnar structures.

33. The process of claim 19, wherein the semiconductor substrate includes at least one layer of material of the first conductivity type and the trenches extend within at least one of the at least one layers.

34. The process of claim 33, further comprising forming the trenches.

35. The process of claim 33, further comprising forming the trenches having their sides aligned along a crystallographic plane of the semiconductor substrate.

* * * * *

UNITED STATES PATENT AND TRADEMARK OFFICE
CERTIFICATE OF CORRECTION

PATENT NO. : 8,455,318 B2
APPLICATION NO. : 12/298025
DATED : June 4, 2013
INVENTOR(S) : Alfio Guarnera et al.

It is certified that error appears in the above-identified patent and that said Letters Patent is hereby corrected as shown below:

In the Specifications:

Col. 6, line 27, should read:
100 keV; and a second deep implantation to obtain deep-body Signed and Sealed this
Sixteenth Day of July, 2013

Teresa Stanek Rea
*Acting Director of the United States Patent and Trademark Office*